US006974745B2

(12) United States Patent
Lee et al.

(10) Patent No.: US 6,974,745 B2
(45) Date of Patent: Dec. 13, 2005

(54) METHOD OF MANUFACTURING SEMICONDUCTOR DEVICE

(75) Inventors: Min Yong Lee, Seoul (KR); Yong Seok Eun, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 136 days.

(21) Appl. No.: 10/657,871

(22) Filed: Sep. 9, 2003

(65) Prior Publication Data

US 2004/0115924 A1 Jun. 17, 2004

(30) Foreign Application Priority Data

Dec. 14, 2002 (KR) ...................... 10-2002-0079998

(51) Int. Cl.[7] .......................................... H01L 21/8242

(52) U.S. Cl. ...................... 438/241; 438/128; 438/129; 438/598; 438/253; 438/396

(58) Field of Search ................................ 438/253–256, 438/396–399, 241, 257, 128–129, 598–599, 438/734, 736

(56) References Cited

U.S. PATENT DOCUMENTS 5,854,110 A * 12/1998 Kunitou ...................... 438/275
6,093,629 A * 7/2000 Chen .......................... 438/597
6,124,178 A * 9/2000 Sung et al. ................. 438/308
6,200,855 B1 * 3/2001 Lee ............................ 438/255
6,353,269 B1 * 3/2002 Huang ........................ 257/296
6,727,540 B2 * 4/2004 Divakaruni et al. ........ 257/301

* cited by examiner

*Primary Examiner*—Jennifer Kennedy
(74) *Attorney, Agent, or Firm*—Ladas & Parry LLP

(57) ABSTRACT

Disclosed is a method of manufacturing semiconductor devices, which can improve electrical characteristics of semiconductor devices. The method of manufacturing comprises the following steps of: forming a plurality of gates on a semiconductor substrate; forming an insulation layer on an entire surface of the semiconductor substrate to coat the plurality of gates; selectively removing the insulation layer by using a first mask pattern to form a contact hole, which exposes a source/drain junction and a conductive layer in a portion of the gates in the semiconductor substrate; removing the first mask pattern and forming a second mask pattern on the selectively removed insulation layer, the second mask pattern exposing the p+ source/drain junction in the semiconductor substrate; implanting ion into the p+ source/drain junction in the semiconductor substrate by using the second mask pattern as a mask; removing the second mask pattern and rapid thermal annealing the entire substrate in a activation temperature range of dopant which is implanted in the ion implantation step; and burying the contact hole with conductive material to form a bit line contact plug. The invention can effectively reduce bit line contact resistance but raise resistance uniformity without variation in related techniques such as etching and contact material for forming contacts.

9 Claims, 4 Drawing Sheets

FIG.5

| Items | | Base | S1 | S2 | S3 | S4 |
|---|---|---|---|---|---|---|
| P+add imp(15KeV, BF2) | | 2.00E+15 | | 3.00E+15 | | 4.00E+15 |
| P+Add RTA | | 800℃,20s | 830℃, 20s | | 800℃, 20s | |
| Vtsat2.5(10/0.22) | V | 0.312 | 0.306 | 0.317 | 0.319 | 3.22 |
| Idsat2.5(10/0.22) | uA/vm | 219 | 224 | 223 | 219 | 219.8 |
| BVdss(10/0.22_@10n) | V | 6.4 | 6.5 | 6.5 | 6.6 | 6.6 |
| N+ RS(3.6*360) | Ω /□ | 134.9 | 134.8 | 135.1 | 135.1 | 135.1 |
| P+ RS(3.6*360) | Ω /□ | 256.3 | 255 | 254.5 | 254.2 | 253.8 |
| BLC2 to P+(0.20) | Ω /ea | 1414 | 1410 | 1083 | 1098 | 1050 |

METHOD OF MANUFACTURING SEMICONDUCTOR DEVICE

BACKGROUND OF THE INVENTION

1. Field of the Invention

The present invention relates to a method of manufacturing semiconductor devices, and more particularly to a method of manufacturing semiconductor devices, which can reduce bit line contact resistance and raise resistance uniformity thereby improving electrical characteristics of devices.

2. Description of the Prior Art

In general, the art currently requires high yield and integration in order to obtain high productive semiconductor devices. Accordingly, resistance within a device is necessarily minimized to accelerate its operation as well as reduce power consumption. This also ensures transistor characteristics for stable transistor operation.

In order to realize the above requirements, a conventional method of manufacturing semiconductor devices activates dopant, which functions to form S/D junctions of a Peri transistor by Rapid Thermal Annealing (RTA).

In the above conventional method, a p+ source/drain junction is in contact with bit lines. In order to reduce the bit line contact resistance, the conventional method first increases the impurity concentration of the p+ source/drain junction and then activates dopant by RTA.

However, the conventional manufacture method for semiconductor devices has the following problems.

The conventional manufacture method requires annealing to be performed at a higher temperature since the contact resistance is increased in proportion to reduction in the size of a semiconductor device. In higher temperature annealing, since thermal activation of dopant is proportional to temperature, resistance is not reduced at a temperature exceeding a proper temperature, but dopant may be deactivated to increase resistance instead.

As a result, high temperature annealing creates residue stress thereby degrading refresh characteristics. Further, RTA disadvantageously lowers resistance uniformity.

SUMMARY OF THE INVENTION

Accordingly, the present invention has been made to solve the above-mentioned problems occurring in the prior art, and an object of the present invention is to provide a method of manufacturing semiconductor devices, which can perform junction-forming doping at a suitable concentration without raising the temperature of heat treatment to reduce bit line contact resistance but to raise resistance uniformity thereby improving electrical characteristics of semiconductor devices.

In order to accomplish this object, there is provided a method of manufacturing semiconductor devices, the method comprising the following steps of: forming a plurality of gates on a semiconductor substrate; forming an insulation layer on an entire surface of the semiconductor substrate to coat the plurality of gates; selectively removing the insulation layer by using a first mask pattern to form a contact hole, which exposes a source/drain junction and a conductive layer in a portion of the gates in the semiconductor substrate; removing the first mask pattern and forming a second mask pattern on the selectively removed insulation layer, the second mask pattern exposing the p+ source/drain junction in the semiconductor substrate; implanting ion into the p+ source/drain junction in the semiconductor substrate by using the second mask pattern as a mask; removing the second mask pattern and rapid thermal annealing the entire substrate in a activation temperature range of dopant which is implanted in the ion implantation step; and burying the contact hole with conductive material to form a bit line contact plug.

The present invention can effectively reduce bit line contact resistance and yet raise resistance uniformity.

BRIEF DESCRIPTION OF THE DRAWINGS

The above and other objects, features and advantages of the present invention will be more apparent from the following detailed description taken in conjunction with the accompanying drawings, in which:

FIG. 5 is a table illustrating experimental data according to the preferred embodiment of the invention.

DETAILED DESCRIPTION OF THE PREFERRED EMBODIMENTS

Hereinafter, a preferred embodiment of the present invention will be described with reference to the accompanying drawings.

FIGS. 1 to 4 are sectional views illustrating process steps of a method of manufacturing semiconductor devices according to a preferred embodiment of the invention.

Figure 1:
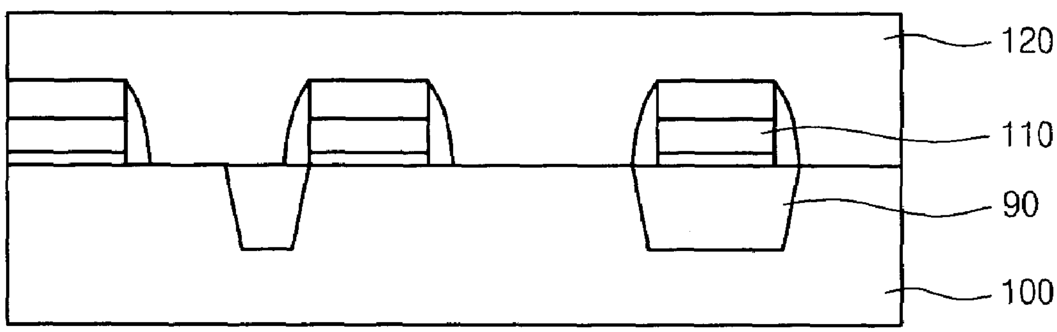
FIGS. 1 to 4 are sectional views illustrating process steps of a method of manufacturing semiconductor devices according to a preferred embodiment of the invention.

As shown in FIG. 1, the method of manufacturing semiconductor devices according to the preferred embodiment of the invention primarily forms a trench in a semiconductor substrate 100 to make a device isolation layer 90, forms a plurality of gates 110 on the semiconductor substrate 100, and then implants ion to form source/drain junctions under both lateral portions of the gates 110. In order to form the source/drain junctions, ion is implanted with the dose of $3\times10^{15}$ atoms/cm$^2$ and the energy of 20 keV.

An insulation layer 120 is formed on an entire surface of the semiconductor substrate 100 to completely cover the plurality of gates 110. In the preferred embodiment of the invention, the insulation layer 120 comprises an oxide film and a nitride film.

Figure 2:
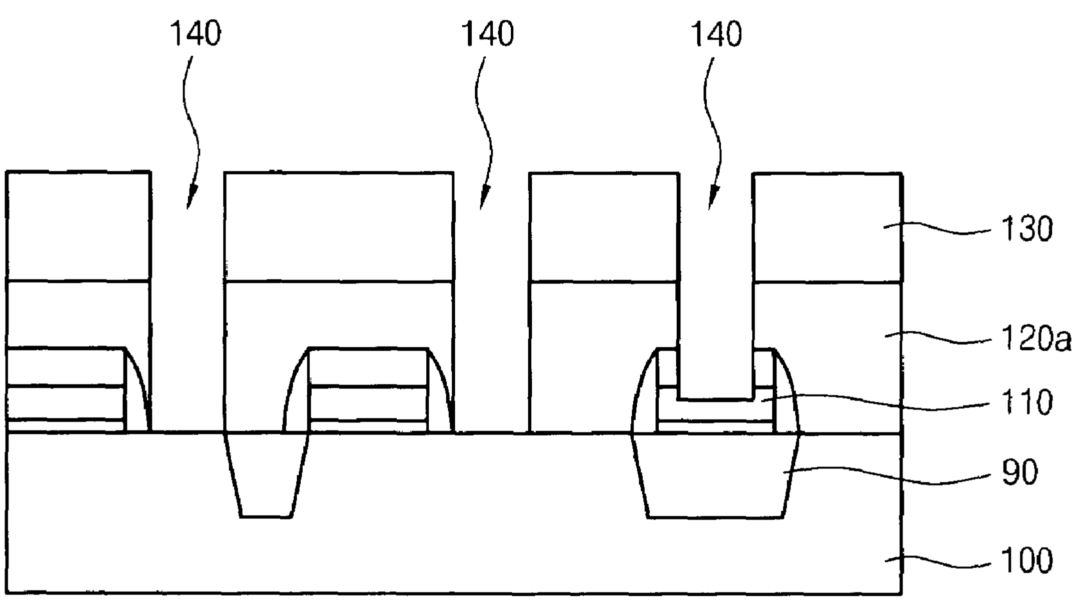

Then, as shown in FIG. 2, a photoresist is coated on the insulation layer 120 and then the photoresist is patterned by photolithography process to form a first mask pattern 130. In subsequence, the insulation layer 120 is selectively removed by etch process using the first mask pattern 130 as an etching mask. As a result, some portions of the patterned insulation layer **120*a* are opened to form contact holes 140, which expose conductive layers of some portions of the gates 110** and the source/drain junctions of the semiconductor substrate.

Figure 3:
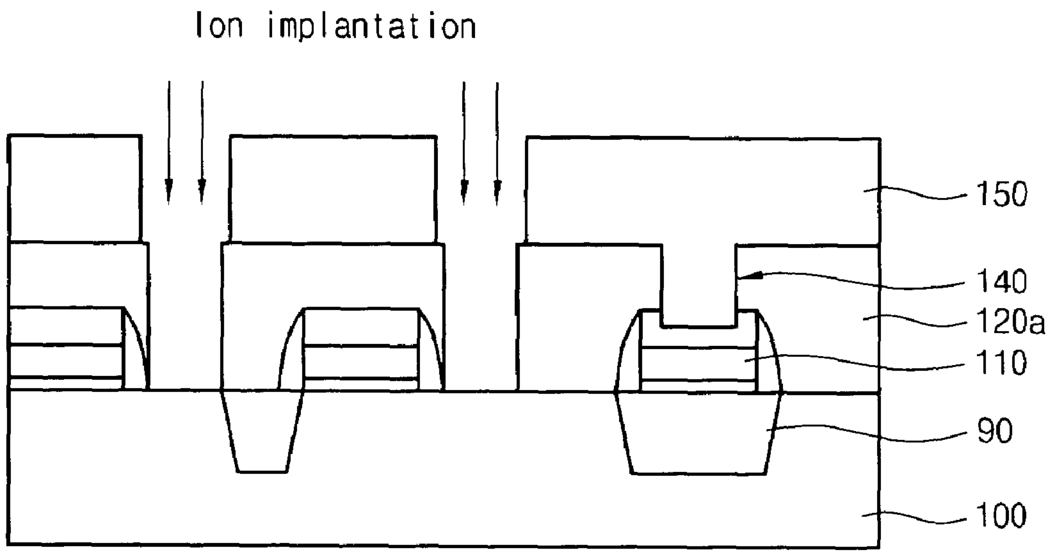

Then, as shown in FIG. 3, the first mask pattern 130 is removed and the photoresist is then coated on the patterned insulation layer **120*a*. The photoresist is patterned to form a second mask pattern 150**, which exposes the p+ source/drain junctions of the semiconductor substrate.

In subsequence, the second mask pattern 150 is used as a mask to perform additional ion implantation, in which a predetermined quantity of ion is implanted into the p+ junctions of the substrate 100.

According to the preferred embodiment of the invention as afore described, the additional ion implantation step increases the dose of ion implantation for about 150 to 200% over a conventional dose and the energy of ion implantation for about 50 to 120% over a conventional one. The additional ion implantation step is preferably performed with the dose of 4.5~6×$10^{15}$ atoms/$cm^2$ and the energy of 10~24 keV.

The additional ion implantation step according to the preferred embodiment of the invention is so carried out to adjust a tilt angle to a range of about 0 to 60 degrees, an orientation to a range of about 0 to 90 degrees, and rotation within four times.

Figure 4:
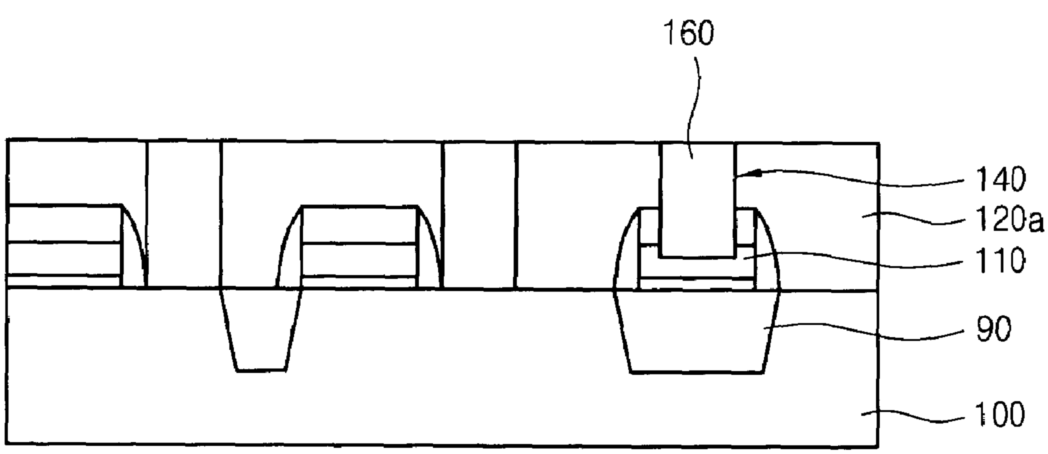

After the additional ion implantation step is completed, the second mask pattern 150 is removed as shown in FIG. 4. Then, heat treatment is performed rapidly to the entire semiconductor substrate 100 within an activation temperature range of dopant, in which dopant implanted in the additional ion implantation step can be activated.

Heat treatment is carried out based upon Rapid Thermal Annealing (RTA) according to the preferred embodiment of the invention, preferably, at a temperature of about 830° C. or less and a heating rate of about 10 to 100° C./sec using $N_2$ gas as purge gas, at a flow rate of about 1 to 25 slm.

After completion of rapid thermal annealing, the contact holes 140 are buried by conductive material in order to form contact plugs 160.

Then, bit lines and so on are formed using known techniques in order to complete a semiconductor device.

Figure 6:
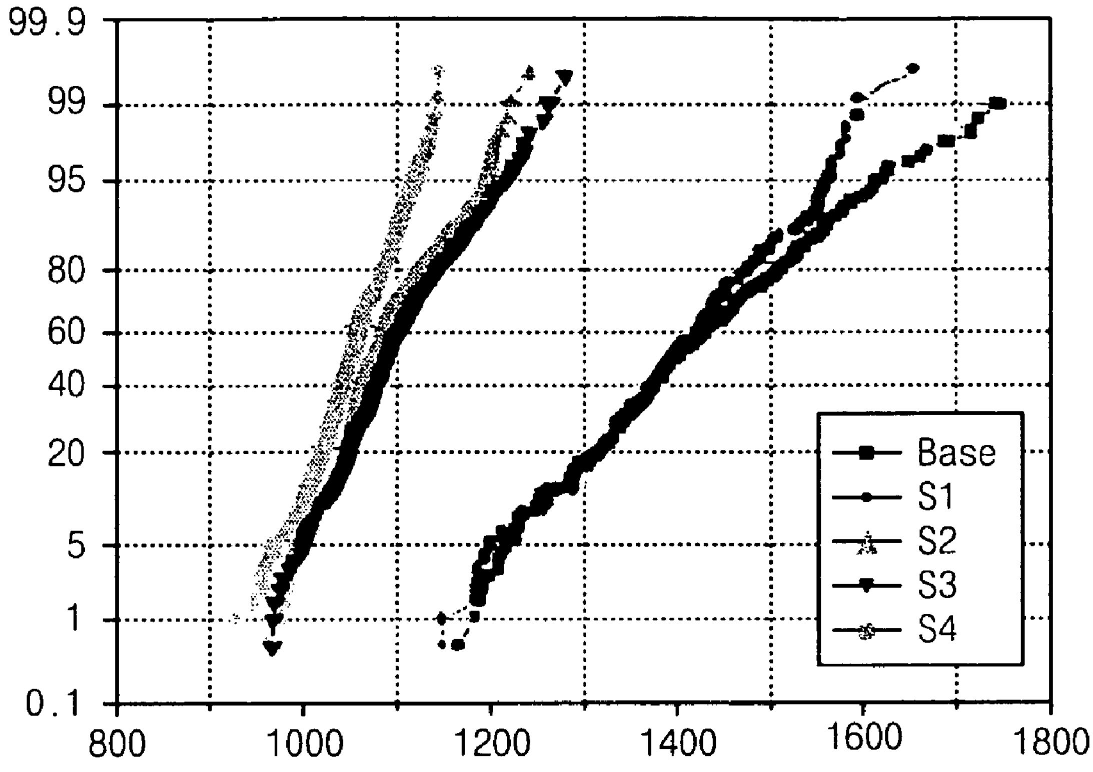
FIG. 6 is a graph illustrating results based upon the experimental data in FIG. 5.

FIG. 5 is a table illustrating experimental data according to the preferred embodiment of the invention, and FIG. 6 is a graph illustrating results based upon the experimental data in FIG. 5.

As can be seen from FIG. 5, when rapid thermal annealing was performed increasing the dose of ion implantation at about 800 and 830° C., bit line contact resistance increases for about 30 to 40% and the uniformity of contact resistance increases for about 40 to 50%.

Although the invention has been shown and described with reference to the certain preferred embodiments thereof, it will be apparent to those skilled in the art that various changes in form and details may be readily made therein without departing from the spirit and scope of the invention as defined by the appended claims.

As described above, the manufacture method for semiconductor devices of the invention can effectively reduce bit line contact resistance while raising resistance uniformity without causing changes to related conditions such as conventional etching and contact material for forming contacts.

What is claimed is:

1. A method of manufacturing semiconductor devices, comprising the steps of:

forming a plurality of gates on a semiconductor substrate;

forming one or more p+ source/drain junctions in the semiconductor substrate by implanting first ions;

forming an insulation layer on an entire surface of the semiconductor substrate to coat the plurality of gates;

selectively removing the insulation layer by using a first mask pattern to form a plurality of contact holes, which expose at least one source/drain junction and a conductive layer of at least one of the plurality of gates in the semiconductor substrate;

removing the first mask pattern and forming a second mask pattern on the selectively removed insulation layer, the second mask pattern exposing only one or more the p+ source/drain junctions in the semiconductor substrate;

implanting dopant ions again into one or more of the p+ source/drain junctions in the semiconductor substrate by using the second mask pattern as a mask;

removing the second mask pattern and rapid thermal annealing the entire substrate in an activation temperature range of dopant which is implanted in the ion implantation step; and burying the contact holes with conductive material to form a bit line contact plug in each contact hole.

2. The method of manufacturing semiconductor devices according to claim 1, wherein the ion implantation step is performed with the dose of 4.5~6×$10^{15}$ atoms/$cm^2$.

3. The method of manufacturing semiconductor devices according to claim 1, wherein the ion implantation step is performed with the energy of 10~24 keV.

4. The method of manufacturing semiconductor devices according to claim 1, wherein a tilt angle is adjusted in a range of about 0 to 60 degrees in the ion implantation step.

5. The method of manufacturing semiconductor devices according to claim 1, wherein an orientation is adjusted in a range of about 0 to 90 degrees in the ion implantation step.

6. The method of manufacturing semiconductor devices according to claim 1, wherein rotation is adjusted zero to four times during the ion implantation step.

7. The method of manufacturing semiconductor devices according to claim 1, wherein the rapid thermal annealing is performed at a temperature of 830° C. or less.

8. The method of manufacturing semiconductor devices according to claim 7, wherein the rapid thermal annealing uses 1 to 25 slm $N_2$ gas as a purge gas.

9. The method of manufacturing semiconductor devices according to claim 7, wherein the rapid thermal annealing is performed at a heating rate of about 10 to 100° C./sec.

* * * * *